US010068982B2

(12) United States Patent
Chang et al.

(10) Patent No.: US 10,068,982 B2
(45) Date of Patent: Sep. 4, 2018

(54) STRUCTURE AND FORMATION METHOD OF SEMICONDUCTOR DEVICE STRUCTURE WITH METAL GATE

(71) Applicant: Taiwan Semiconductor Manufacturing Co., Ltd, Hsin-Chu (TW)

(72) Inventors: Che-Cheng Chang, New Taipei (TW); Tung-Wen Cheng, Hsinchu County (TW); Mu-Tsang Lin, Hemei Township (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 14/290,569

(22) Filed: May 29, 2014

(65) Prior Publication Data

US 2015/0348965 A1    Dec. 3, 2015

(51) Int. Cl.
```
H01L 29/49      (2006.01)
H01L 21/8238    (2006.01)
H01L 29/66      (2006.01)
H01L 29/423     (2006.01)
H01L 29/40      (2006.01)
H01L 27/092     (2006.01)
```
(52) U.S. Cl.
CPC .. *H01L 29/4966* (2013.01); *H01L 21/823842* (2013.01); *H01L 21/823878* (2013.01); *H01L 27/092* (2013.01); *H01L 29/401* (2013.01); *H01L 29/42372* (2013.01); *H01L 29/66545* (2013.01)

(58) Field of Classification Search
CPC ......... H01L 29/4966; H01L 21/823842; H01L 21/82345; H01L 29/66545; H01L 27/092; H01L 27/0922; H01L 29/42372
See application file for complete search history.

(56) References Cited

U.S. PATENT DOCUMENTS

| | | | |
|---|---|---|---|
| 2009/0170267 A1* | 7/2009 | Shah | H01L 21/823821 438/283 |
| 2012/0001259 A1* | 1/2012 | Chuang et al. | 257/331 |
| 2012/0286375 A1* | 11/2012 | Cai et al. | 257/412 |
| 2013/0012021 A1* | 1/2013 | Lee | H01L 29/49 438/672 |
| 2013/0082332 A1* | 4/2013 | Liu | H01L 29/4966 257/369 |
| 2013/0320410 A1* | 12/2013 | Lin, Jr. | H01L 29/78 257/288 |
| 2014/0061813 A1* | 3/2014 | Yu | H01L 27/1104 257/369 |
| 2015/0069524 A1* | 3/2015 | Hong et al. | 257/392 |

(Continued)

*Primary Examiner* — Daniel Luke
(74) *Attorney, Agent, or Firm* — Birch, Stewart, Kolasch & Birch, LLP

(57) ABSTRACT

A structure and a formation method of a semiconductor device structure are provided. The semiconductor device structure includes a semiconductor substrate and a gate stack over the semiconductor substrate. The gate stack includes a work function layer and a metal filling over the work function layer. The semiconductor device structure also includes a dielectric structure over the semiconductor substrate and adjacent to the gate stack. The dielectric structure is in direct contact with the work function layer and the metal filling.

20 Claims, 12 Drawing Sheets

(56) References Cited

U.S. PATENT DOCUMENTS

2015/0170974 A1\* 6/2015 Xu et al. .................. 438/216
2015/0249086 A1\* 9/2015 Divakaruni ....... H01L 21/76283
                                                                  257/369

\* cited by examiner

STRUCTURE AND FORMATION METHOD OF SEMICONDUCTOR DEVICE STRUCTURE WITH METAL GATE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, these advances have increased the complexity of processing and manufacturing ICs.

Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
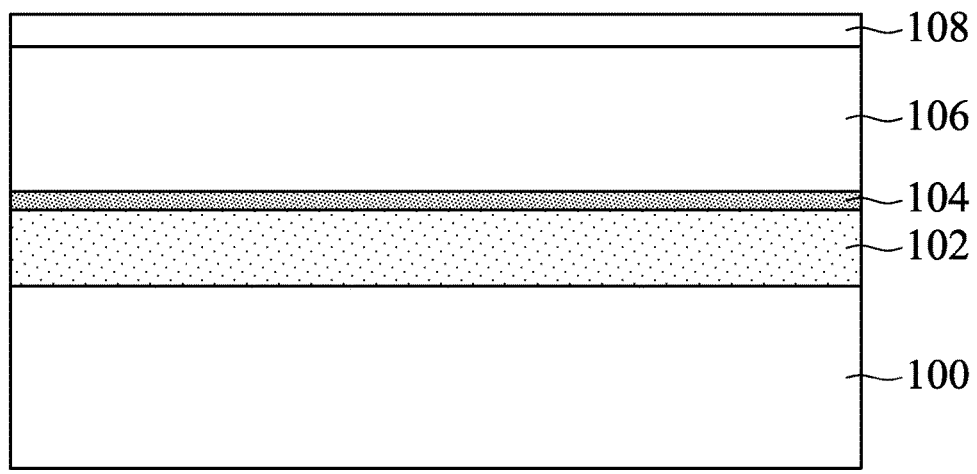
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1G are cross-sectional views of various stages of a process for forming a semiconductor device structure, in accordance with some embodiments. As shown in FIG. 1A, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, other suitable compound semiconductors, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, other applicable methods, or a combination thereof.

As shown in FIG. 1A, an isolation structure 102 is formed over the semiconductor substrate 100, in accordance with some embodiments. In some embodiments, the isolation structure 102 is used to define and/or surround active regions (not shown) of the semiconductor substrate 100. In some embodiments, the isolation structure 102 is made of a dielectric material. The dielectric material may include silicon oxide, silicon nitride, silicon oxynitride, fluoride-doped silicate glass (FSG), low-K dielectric material, other suitable materials, or a combination thereof. In some embodiments, the isolation structure 102 is formed using a shallow trench isolation (STI) process, a local oxidation of silicon (LOCOS) process, other applicable processes, or a combination thereof.

As shown in FIG. 1A, a gate dielectric layer 104 and a dummy gate electrode layer 106 are deposited over the semiconductor substrate 100 and the isolation structure 102, in accordance with some embodiments. In some embodiments, the gate dielectric layer 104 is made of silicon oxide, silicon nitride, silicon oxynitride, dielectric material with high dielectric constant (high-K), other suitable dielectric materials, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, other suitable high-K materials, or a combination thereof. In some embodiments, the gate dielectric layer 104 is a dummy gate dielectric layer which will be removed subsequently. The dummy gate dielectric layer is, for example, a silicon oxide layer. In some embodiments, the gate dielectric layer 104 is deposited using a chemical vapor deposition (CVD) process, an atomic layer deposition (ALD) process, a thermal oxidation process, other applicable processes, or a combination thereof. In some embodiments, the dummy gate electrode layer 106 is made of polysilicon. For example, the dummy gate electrode layer 106 is deposited using a CVD process.

Afterwards, a patterned hard mask layer 108 is formed over the dummy gate electrode layer 106, as shown in FIG.

1A in accordance with some embodiments. The patterned hard mask layer 108 is used to pattern the dummy gate electrode layer 106 and the gate dielectric layer 104 into one or more dummy gate stacks. In some embodiments, the dummy gate stacks are multiple dummy gate lines formed over the semiconductor substrate 100. In some embodiments, the dummy gate lines are substantially parallel to each other. In some embodiments, each of the dummy gate stacks (or dummy gate lines) is formed into two or more gate stacks of different transistors in subsequent processes.

In some embodiments, the patterned hard mask layer 108 includes multiple layers such as a silicon nitride layer and a silicon oxide layer. In some embodiments, a patterned photoresist layer (not shown) is used to assist in the formation of the patterned hard mask layer 108. The patterned photoresist layer is formed using a photolithography process. The photolithography process may include photoresist coating (e.g., spin-on coating), soft baking, mask aligning, exposure, post-exposure baking, developing the photoresist, rinsing, drying (e.g., hard baking), other suitable processes, or a combination thereof. In some embodiments, a line cur pattern of the patterned photoresist layer is transferred to the patterned hard mask layer 108.

Figure 1B:
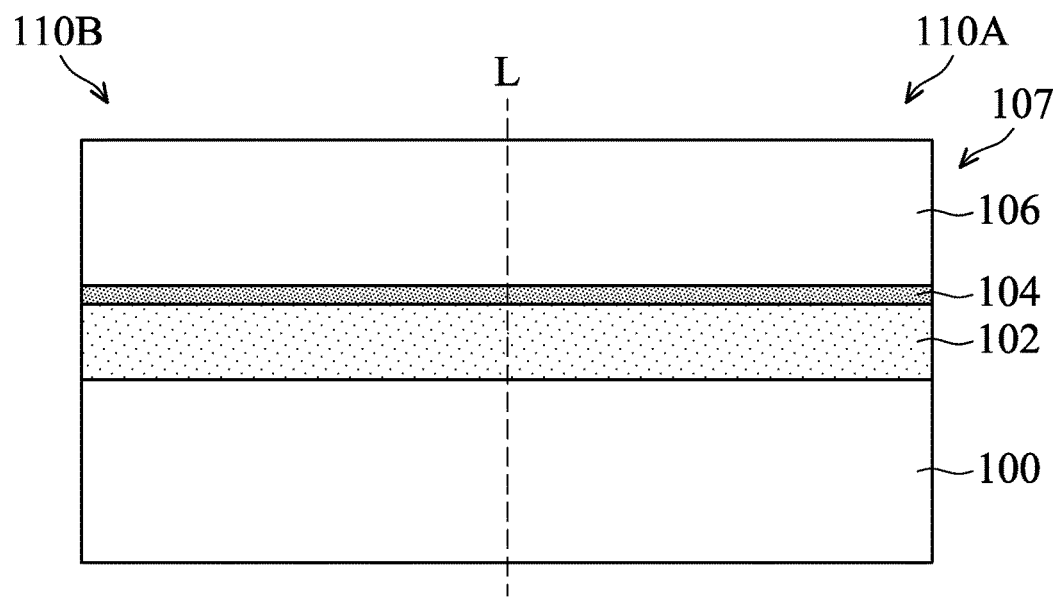
Figure 2A:
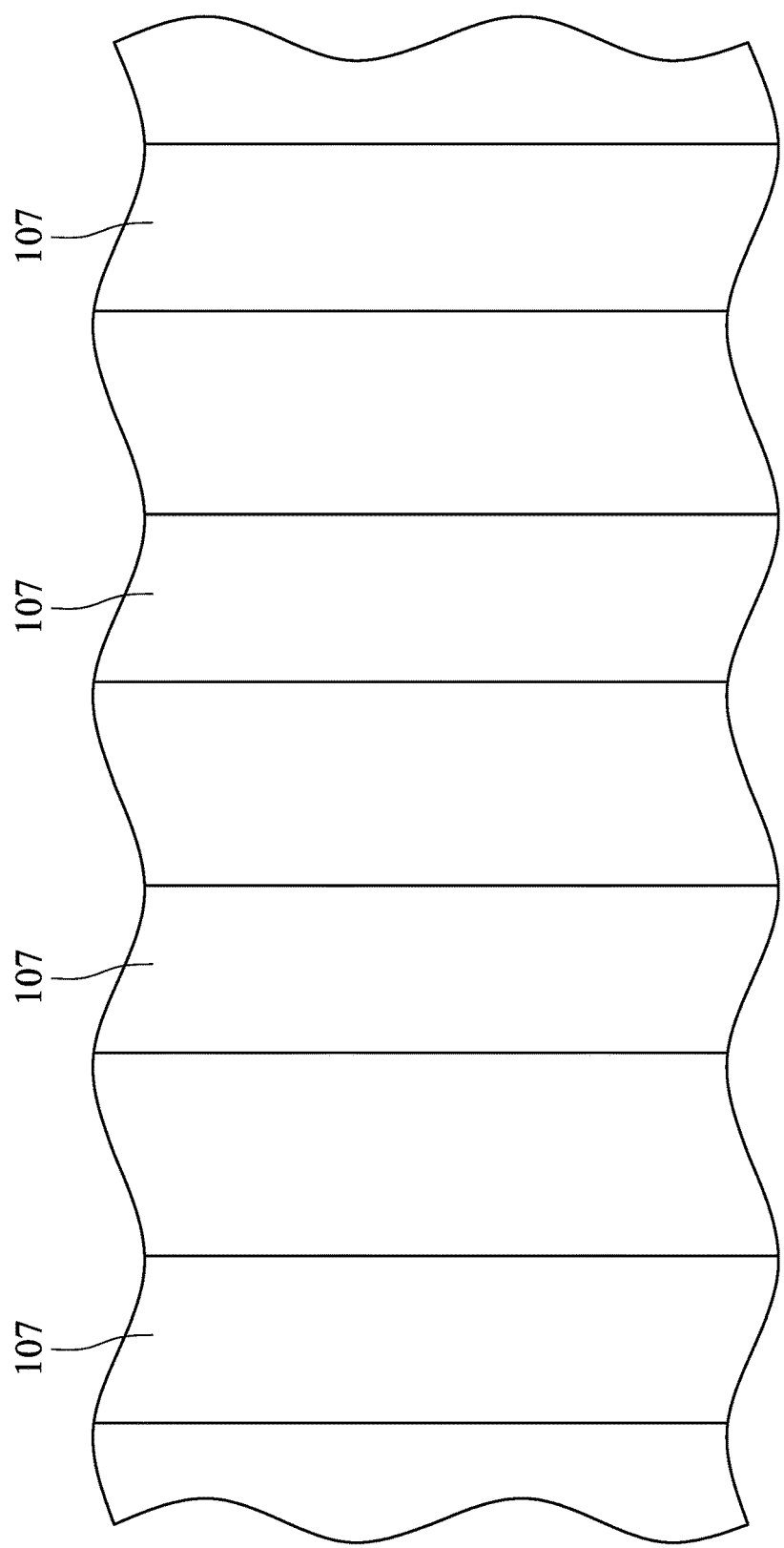
FIGS. 2A-2G are top views of various stages of a process for forming a semiconductor device structure, in accordance with some embodiments.

Afterwards, the dummy gate electrode layer 106 and the gate dielectric layer 104 are patterned to form one or more dummy gate stacks 107, as shown in FIG. 1B in accordance with some embodiments. In some embodiments, the patterned hard mask layer 108 is removed. FIGS. 2A-2G are top views of various stages of a process for forming a semiconductor device structure, in accordance with some embodiments. As shown in FIGS. 1B and 2A, multiple dummy gate stacks 107 are formed, in accordance with some embodiments. Each of the dummy gate stacks 107 includes the dummy gate electrode layer 106 and the gate dielectric layer 104.

Figure 2C:
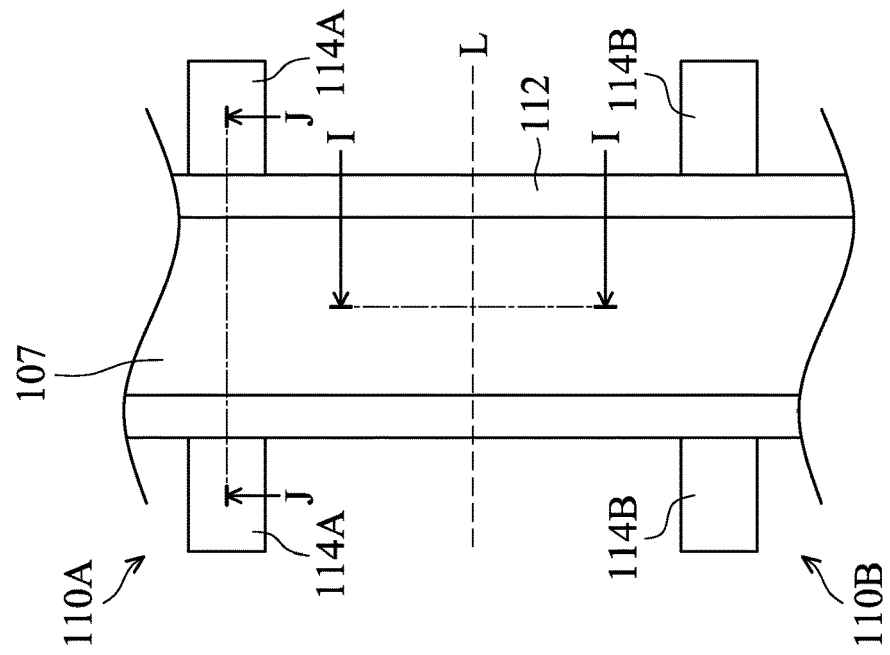
Figure 2B:
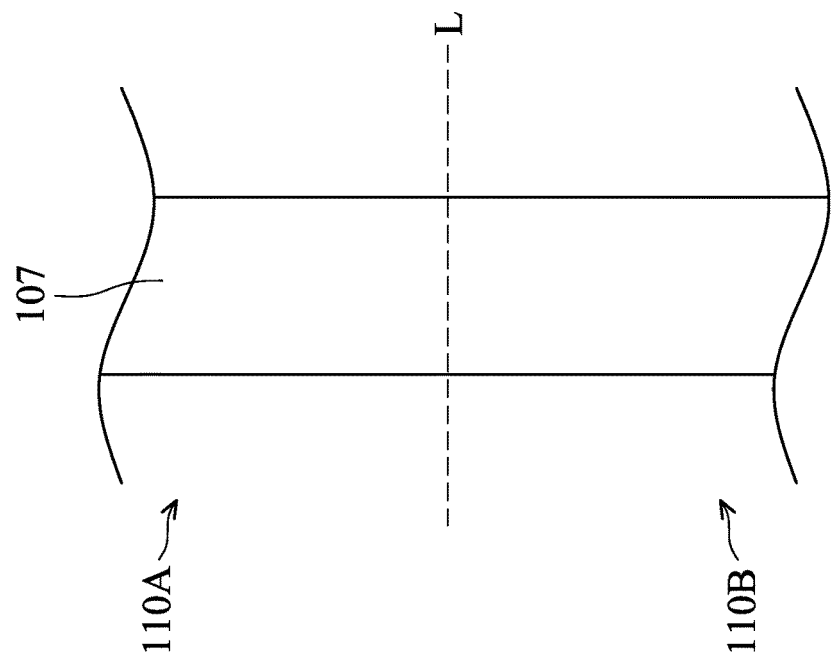
Figure 2E:
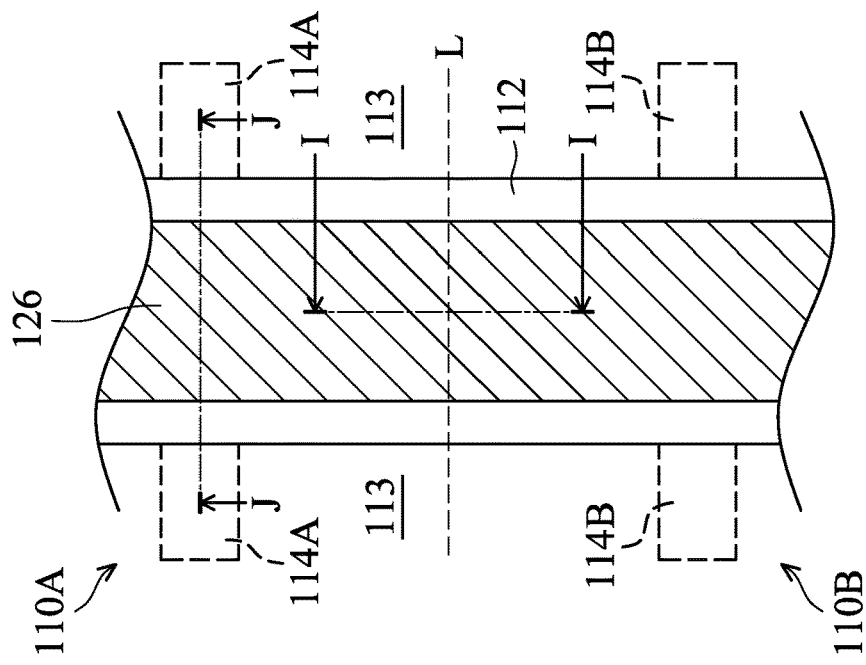

In FIGS. 1B and 2B, only one of the dummy gate stacks 107 is shown for sake of brevity. As shown in FIGS. 1B and 2B, the semiconductor substrate 100 is separated into portions 110A and 110B by an imaginary line L. In some embodiments, two transistors are formed in and over the portions 110A and 110B of the semiconductor substrate 100. In some embodiments, a p-type metal-oxide-semiconductor field effect transistor (PMOSFET) and an n-type metal-oxide-semiconductor field effect transistor (NMOSFET) will be formed in and over the portions 110A and 110B, respectively. In some other embodiments, an NMOSFET and a PMOSFET will be formed in and over the portions 110A and 110B, respectively.

Afterwards, doped regions, such as source/drain regions, are formed in the semiconductor substrate 100 and between the dummy gate stack 107, in accordance with some embodiments. FIGS. 3A-3D are cross-sectional views of various stages of a process for forming a semiconductor device structure, in accordance with some embodiments. In some embodiments, FIGS. 1B-1G are cross-sectional views taken along the line I-I of FIGS. 2B-2G. In some embodiments, FIGS. 3A-3C are cross-sectional views taken along the line J-J of FIGS. 2C-2G, and FIG. 3D is a cross-sectional view taken along the line K-K.

Referring to FIGS. 2C and 3A, source/drain regions 114A and 114B are formed in the semiconductor substrate 100 and between the dummy gate stack 107, in accordance with some embodiments. As mentioned above, two transistors are formed in and over the portions 110A and 110B of the semiconductor substrate 100. The source/drain regions 114A are a portion of the transistor formed in and over the portion 110A, and the source/drain region 114B are a portion of another transistor formed in and over the portion 110B. In some embodiments, multiple ion implantation processes are performed to form the source/drain regions 114A and 114B. In some embodiments, spacers 112 are formed over sidewalls of the dummy gate stack 107 to assist in the formation of the source/drain regions 114A and 114B, as shown in FIGS. 2C and 3A. In some embodiments, light doped source/drain regions are formed using ion implantation processes before the spacers 112 are formed.

In some embodiments, the source/drain regions 114A and 114B are doped with different types of dopants. For example, the source/drain regions 114A are doped with one or more p-type dopants, and the source/drain regions 114B are doped with one or more n-type dopants. Alternatively, the source/drain regions 114A and 114B are doped with n-type dopant(s) and p-type dopants, respectively. In some embodiments, implantation masks (not shown) are used to ensure that the source/drain regions 114A and 114B are doped with suitable dopants. In some embodiments, after the formation of the source/drain regions 114A and 114B, a thermal operation is performed to activate the doped impurities.

Embodiments of the disclosure have many variations. In some embodiments, the source/drain region 114A and 114B include epitaxial structures. In some embodiments, the semiconductor substrate 100 is partially removed to form recesses positioned at locations where the source/drain regions 114A and 114B will be formed. Afterwards, stressors are epitaxially grown in the recesses. These stressors may be doped with suitable dopants during their growth or after subsequent ion implantation processes. Similarly, masks are used to ensure that the source/drain region 114A and 114B includes suitable stressors with suitable dopants. In some embodiments, the source/drain regions 114A are a portion of a p-type transistor. In these cases, the source/drain regions 114A include SiGe stressors doped with p-type dopants. In some embodiments, the source/drain regions 114B are a portion of an n-type transistor. In these cases, the source/drain regions 114B include SiC or Si stressors doped with n-type dopants.

Figure 1C:
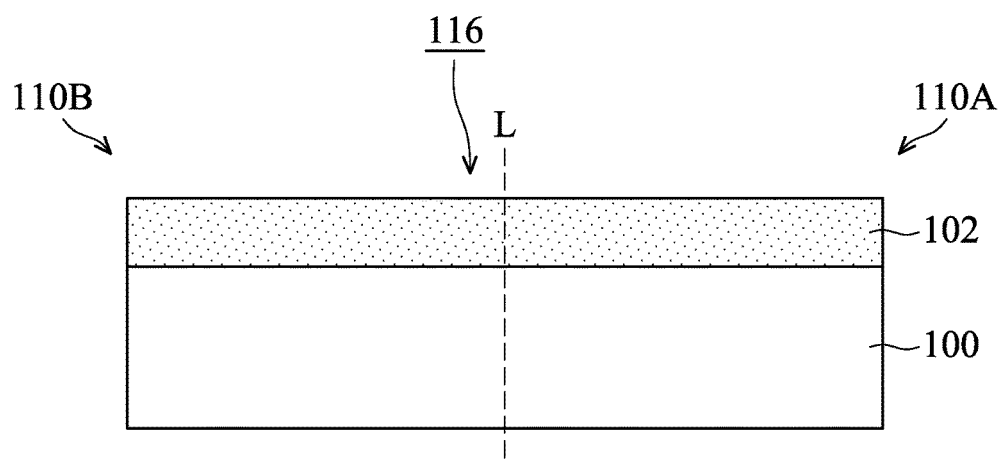
Figure 2D:
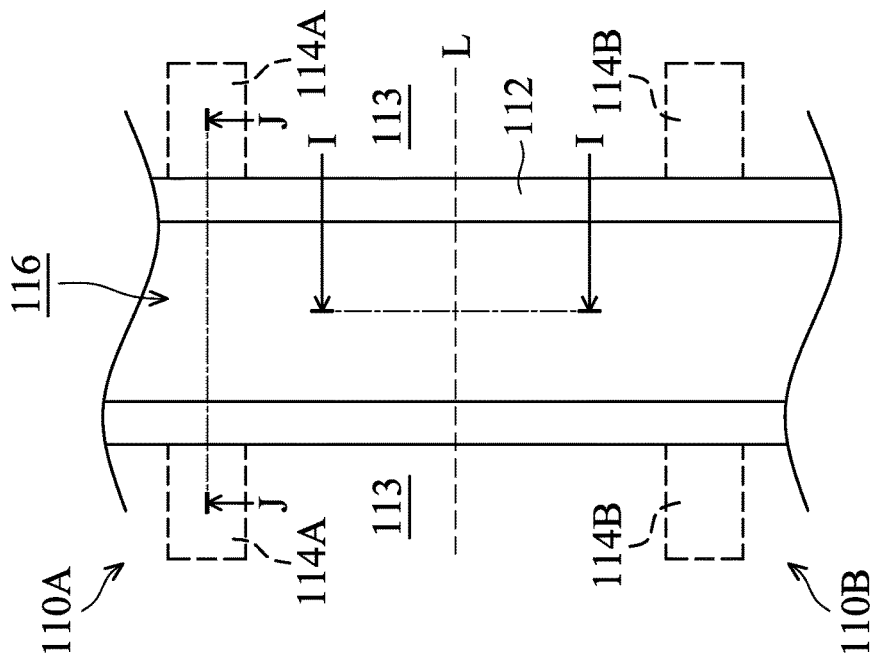
Figure 3A:
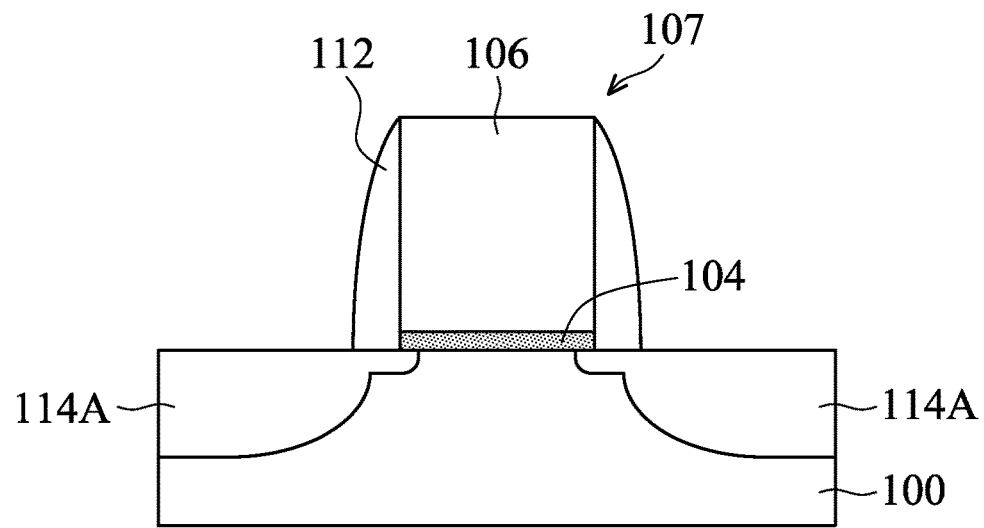
FIGS. 3A-3D are cross-sectional views of various stages of a process for forming a semiconductor device structure, in accordance with some embodiments.
Figure 3B:
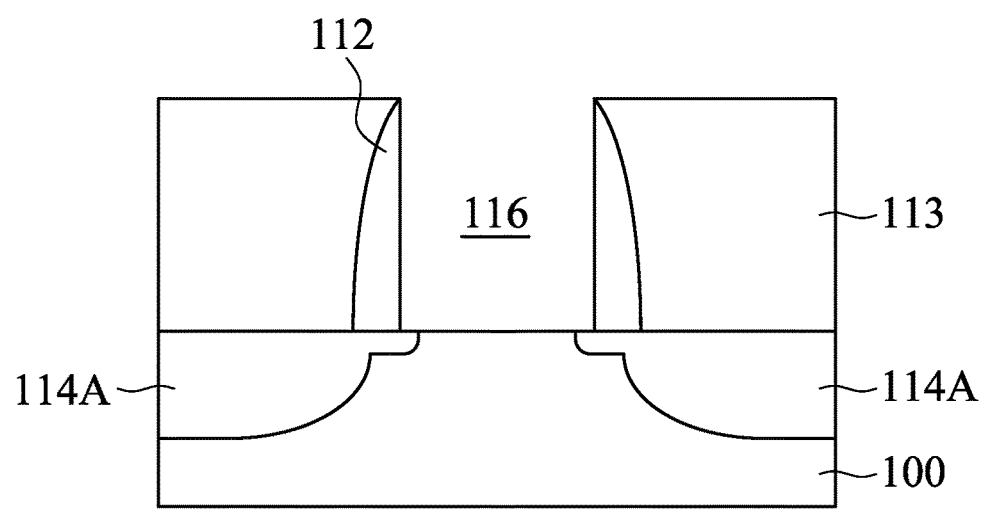
Figure 3C:
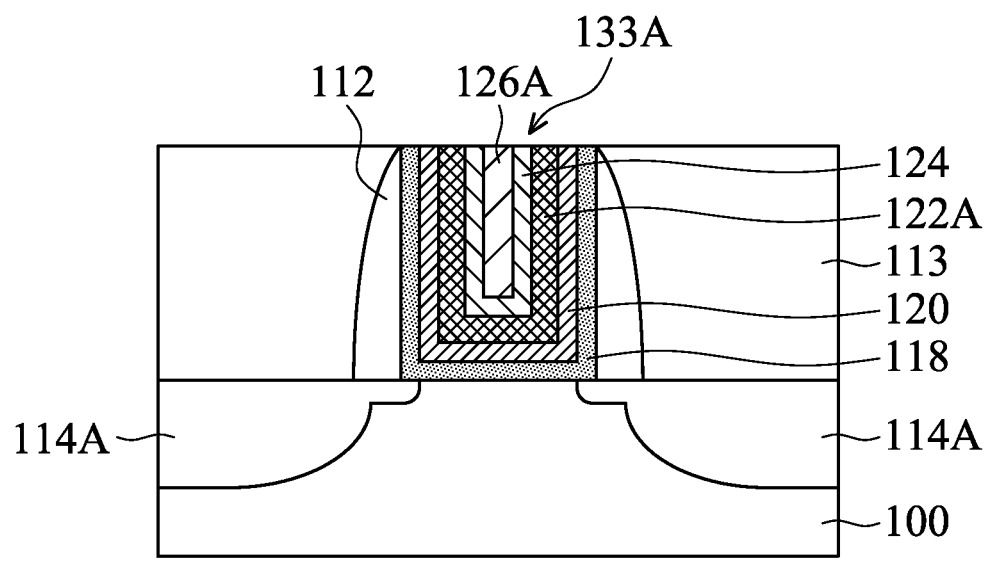

Referring to FIGS. 1C, 2D, and 3B, the dummy gate stack 107 is removed, in accordance with some embodiments. In some embodiments, before the removal of the dummy gate stack 107, a dielectric layer 113 is deposited over the semiconductor substrate 100 and the dummy gate stack 107, as shown in FIGS. 2D and 3B. In some embodiments, the dielectric layer 113 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, other suitable dielectric materials, or a combination thereof. In some embodiments, the dielectric layer 113 is deposited using a CVD process, a spin-on process, other applicable processes, or a combination thereof.

Afterwards, the dielectric layer 113 is thinned down until the dummy gate electrode layer 106 is exposed. The thinned dielectric layer 113 surrounds the dummy gate stack 107. In some embodiments, the dielectric layer 113 is thinned down using a chemical mechanical polishing (CMP) process, a grinding process, an etching process, other applicable processes, or a combination thereof. Embodiments of the disclosure have many variations. In some other embodiments, the dielectric layer 113 is not formed.

Afterwards, the dummy gate stack 107 is removed to form a trench 116 over the semiconductor substrate 100, as shown in FIGS. 2D and 3B in accordance with some embodiments. In some embodiments, the dielectric layer 113 is formed, and the trench 116 is formed in the dielectric layer 113. In other words, the dielectric layer 113 surrounds the trench 116. In some embodiments, the trench 116 is between the spacers 112. In some embodiments, the trench 116 exposes channel regions between the source/drain regions and a portion of the isolation structure 102. In some embodiments, the dummy gate stack 107 is removed using a dry etching process, a wet etching process, other applicable processes, or a combination thereof. In some embodiments, the gate dielectric layer 104 is made of a high-K material and is not removed.

After the removal of the dummy gate stack 107, metal gate stack layers are deposited over the sidewalls and bottom of the trench 116, as shown in FIGS. 1D, 2E, 3C, and 3D in accordance with some embodiments. The metal gate stack layers in the trench 116 may also be called a metal gate stack line. As mentioned above, in some embodiments, each of the dummy gate stacks 107 (or dummy gate lines) will be formed into two or more gate stacks of different transistors. Therefore, the trench 116 formed after the removal of the dummy gate stack 107 is long enough to contain two or more metal gate stacks of transistors. The depositions or fillings of the metal gate stack layers are easier than other cases where the depositions or fillings of the metal gate stack layers are performed in a recess designed to contain only one metal gate stack of a transistor. As a result, the process window is enlarged significantly.

In some embodiments, the metal gate stack layers include a gate dielectric layer, a work function layer, and a metal filling layer. In some embodiments, two transistors are formed in and over the portions 110A and 110B of the semiconductor substrate 100. In some embodiments, one of the transistors is a p-type transistor, and the other one is an n-type transistor. In some embodiments, one or more p-type work function layers are formed over the portion 110A, and one or more n-type work function layers are formed over the portion 110B.

Figure 1D:
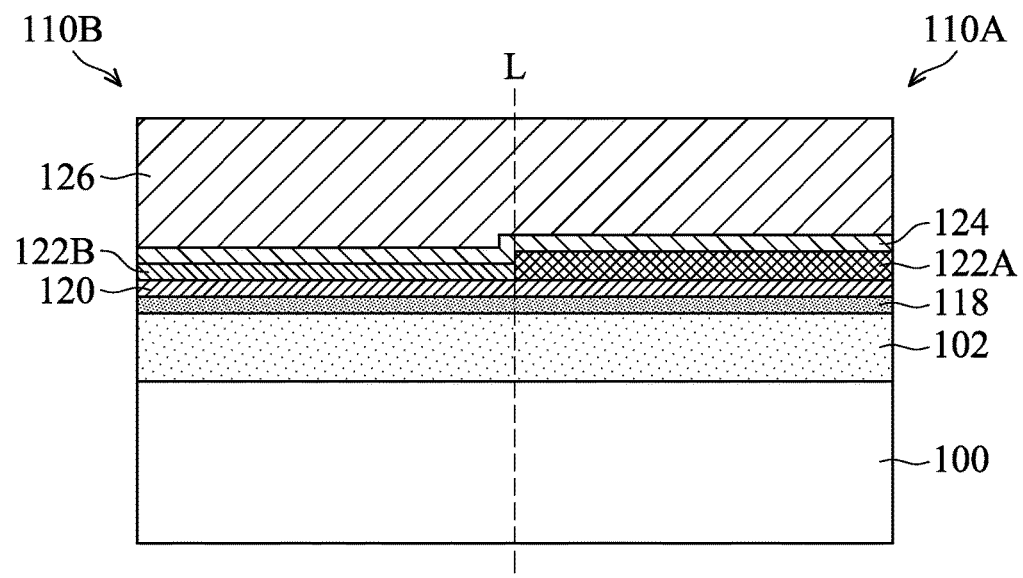
Figure 3D:
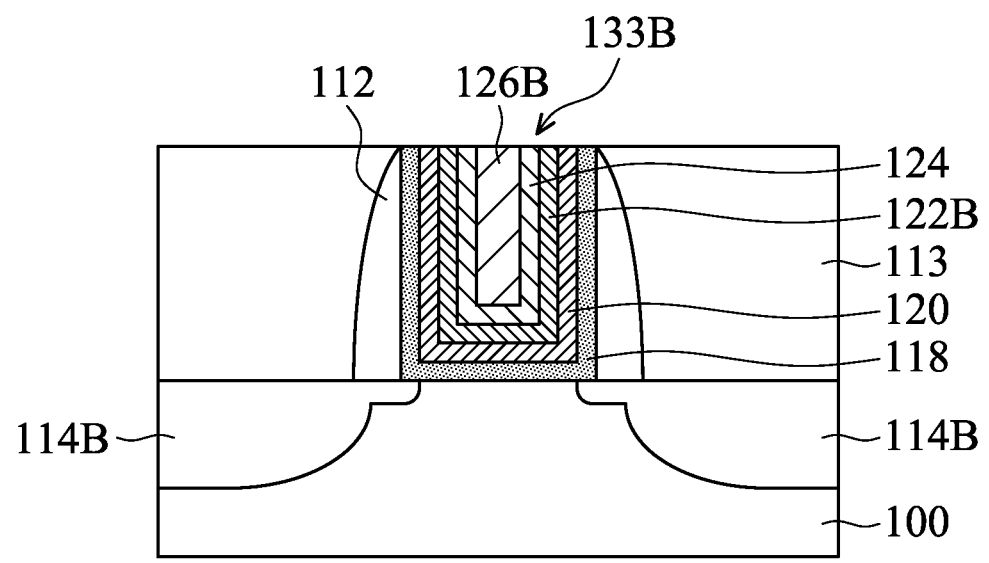

As shown in FIGS. 1D, 3C, and 3D, a gate dielectric layer 118 is deposited over the sidewalls and bottom of the trench 116, in accordance with some embodiments. The gate dielectric layer 118 extends over both of the portions 110A and 110B. In some embodiments, the gate dielectric layer 118 is a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, other suitable high-K materials, or a combination thereof. In some embodiments, the gate dielectric layer 118 is deposited using an ALD process or other applicable processes. In some embodiments, a high temperature annealing operation is performed to reduce or eliminate defects in the gate dielectric layer 118. Embodiments of the disclosure have many variations. In some embodiments, two different gate dielectric layers are formed over the portions 110A and 110B to serve as the gate dielectric layers of different transistors.

In some other embodiments, before the gate dielectric layer 118 is formed, an interfacial layer (not shown) is formed in the trench 116. The interfacial layer may be used to reduce stress between the gate dielectric layer 118 and the semiconductor substrate 100. In some embodiments, the interfacial layer may be made of silicon oxide. In some embodiments, the interfacial layer is formed using an ALD process, a thermal oxidation process, other applicable processes, or a combination thereof.

As shown in FIGS. 1D, 3C, and 3D, a barrier layer 120 is deposited over the gate dielectric layer 118, in accordance with some embodiments. The barrier layer 120 may be used to interface the gate dielectric layer 118 with subsequently formed work function layers. The barrier layer 120 may also be used to prevent diffusion between the gate dielectric layer 118 and the subsequently formed work function layers. In some embodiments, the barrier layer 120 is made of a metal-containing material. The metal-containing material may include titanium nitride, tantalum nitride, other suitable materials, or a combination thereof. In some embodiments, the barrier layer 120 includes multiple layers. In some embodiments, the barrier layer 120 is deposited using an ALD process, a physical vapor deposition (PVD) process, a plating process, other applicable processes, or a combination thereof. In some other embodiments, the barrier layer 120 is not formed.

Afterwards, work function layers 122A and 122B are formed over the barrier layer 120, as shown in FIGS. 1D, 3C, and 3D in accordance with some embodiments. The work function layer is used to provide desired work function for transistors to enhance device performance including improved threshold voltage. In the embodiments of forming an NMOS transistor, the work function layer can be an n-type metal layer capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, other suitable materials, or a combination thereof.

On the other hand, in the embodiments of forming a PMOS transistor, the work function layer can be a p-type metal layer capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be tuned to adjust the work function level. For example, a titanium nitride layer may be used as a p-type metal layer or an n-type metal layer, depending on the thickness and/or the compositions of the titanium nitride layer.

In some embodiments, the work function layer 122A is a p-type metal layer, and the work function layer 122B is an n-type metal layer. In some embodiments, the work function layer 122A is formed before the work function layer 122B. The work function layer 122A is deposited over the barrier layer 120. Afterwards, the work function layer 122A is patterned. For example, the work function layer 122A is positioned over the portion 110A of the semiconductor substrate 100. The portion of the work function layer 122A originally over the portion 110B is removed. For example, a photolithography process and an etching process are used to pattern the work function layer 122A. Similarly, the work function layer 122B is deposited and patterned over the portion 110B of the semiconductor substrate 100.

Embodiments of the disclosure have many variations. In some other embodiments, the work function layer 122B is formed before the work function layer 122A. In some other embodiments, both of the work function layers 122A and 122B have the same conductivity type, such as n-type or p-type.

Afterwards, a blocking layer 124 is deposited over the work function layers 122A and 122B, as shown in FIGS. 1D, 3C, and 3D in accordance with some embodiments. The blocking layer 124 may be used to prevent a subsequently formed metal filling from diffusing or penetrating into the work function layers. In some embodiments, the blocking layer 124 is made of tantalum nitride, titanium nitride, other suitable materials, or a combination thereof. In some embodiments, the blocking layer 124 is deposited using an ALD process, a PVD process, a plating process, other applicable processes, or a combination thereof. In some other embodiments, the blocking layer 124 is not formed. In some other embodiments, two different blocking layers are used between the subsequently formed metal fillings and the different work function layers 122A and 124B.

Afterwards, a metal filling layer 126 is deposited over the blocking layer 124 to fill the trench 116, as shown in FIGS. 1D, 2E, 3C, and 3D in accordance with some embodiments. In some embodiments, the metal filling layer 126 is made of aluminum, tungsten, copper, other suitable materials, or a combination thereof. In some embodiments, the metal filling layer 126 is deposited using a PVD process, a plating process, a CVD process, other applicable processes, or a combination thereof.

In some embodiments, the metal gate stack layers, including the gate dielectric layer 118, the barrier layer 120, the work function layers 122A and 122B, the blocking layer 124, and the metal filling layer 126, together fill the trench 116 and cover the dielectric layer 113. In some embodiments, the metal gate stack layers outside of the trench 116 are removed. For example, a planarization process is used to remove the metal gate stack layers until the dielectric layer 113 is exposed. The planarization process may include a CMP process, a grinding process, an etching process, other applicable processes, or a combination thereof.

Figure 1E:
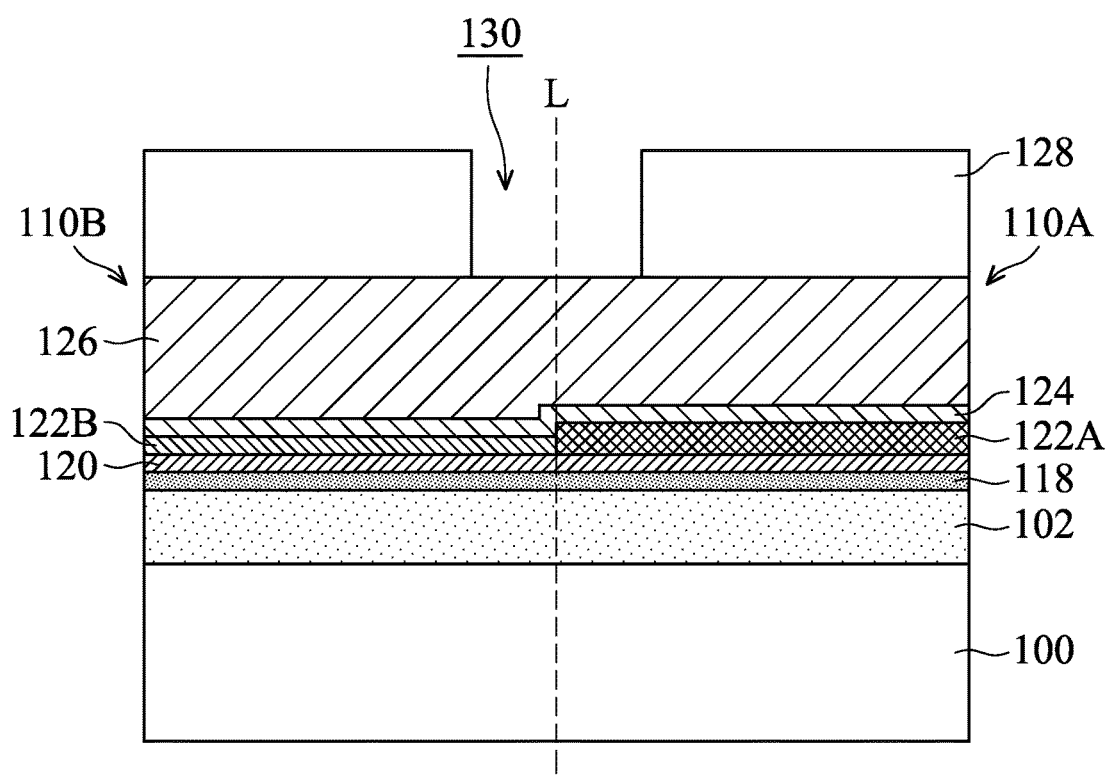

After the formation of the metal gate stack layers in the trench 116, the metal gate stack layers are patterned to form multiple metal gate stacks, in accordance with some embodiments. As shown in FIG. 1E, a mask layer 128 is deposited and patterned over the metal filling layer 126 to assist in the patterning of the metal gate stack layers, in accordance with some embodiments. In some embodiments, the mask layer 128 is made of a photoresist material, silicon nitride, silicon oxynitride, silicon oxide, titanium nitride, other suitable materials, or a combination thereof. The mask layer 128 may be deposited using a spin-on process, a CVD process, other applicable processes, or a combination thereof. For example, a photolithography process and an etching process are used to pattern the mask layer 128. In some embodiments, the mask layer 128 has an opening 130 which exposes a portion of the metal filling layer 126, as shown in FIG. 1E. The imaginary line L separating the semiconductor substrate 100 into the portions 110A and 110B may pass through the opening 130.

Figure 1F:
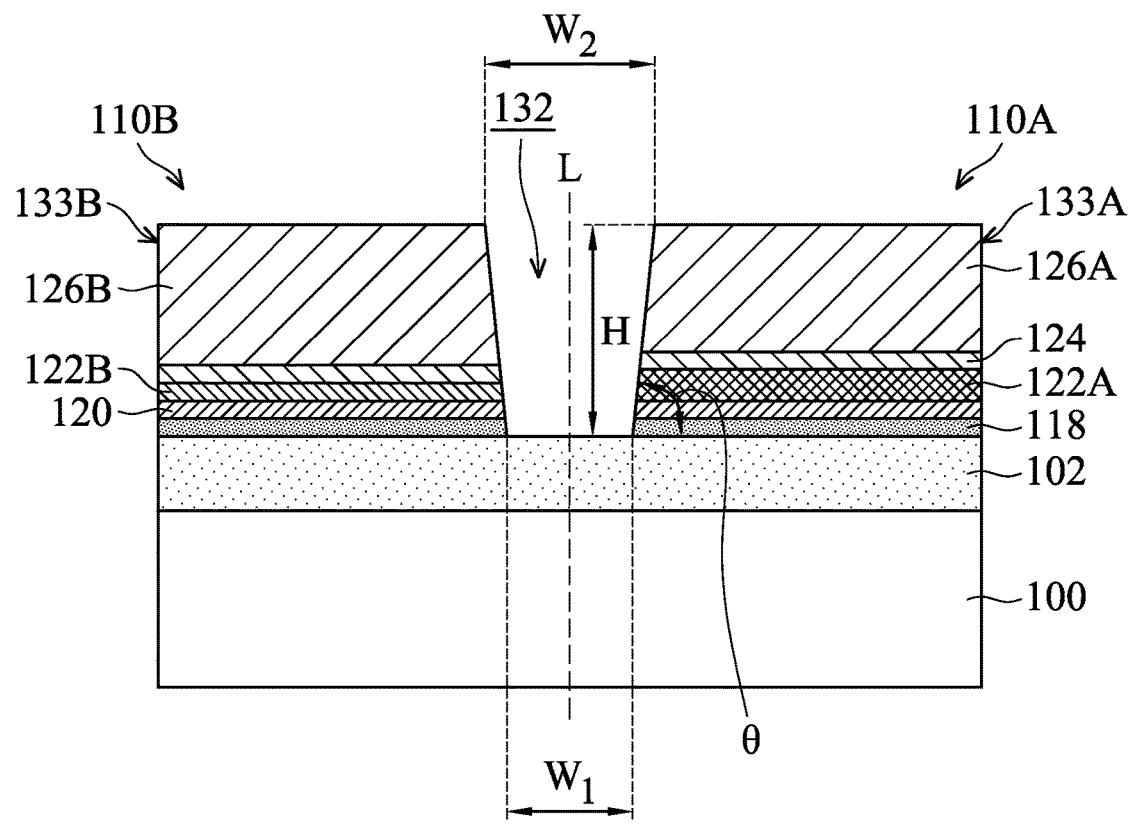
Figure 2G:
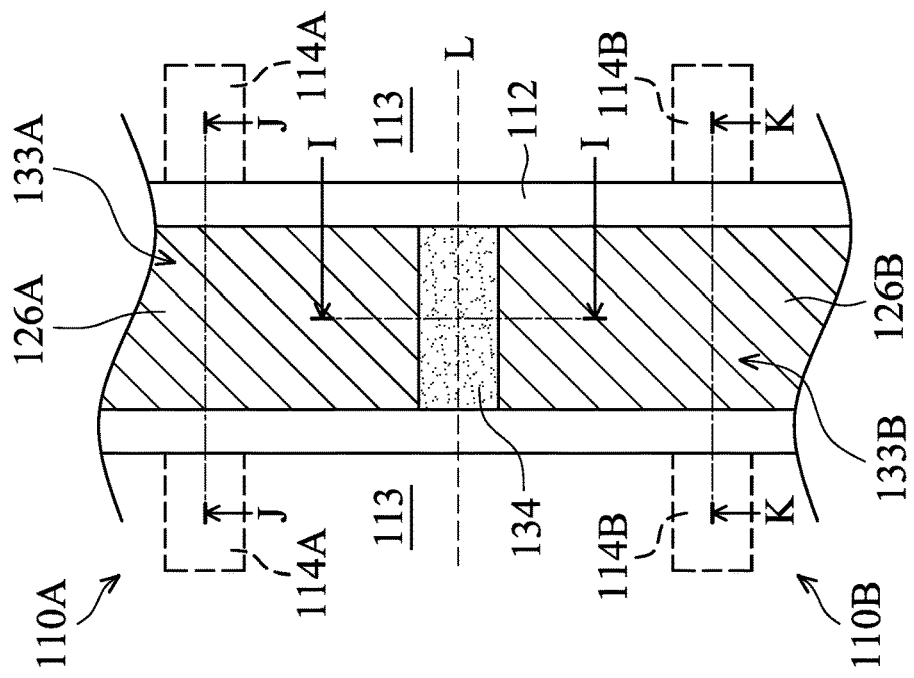
Figure 2F:
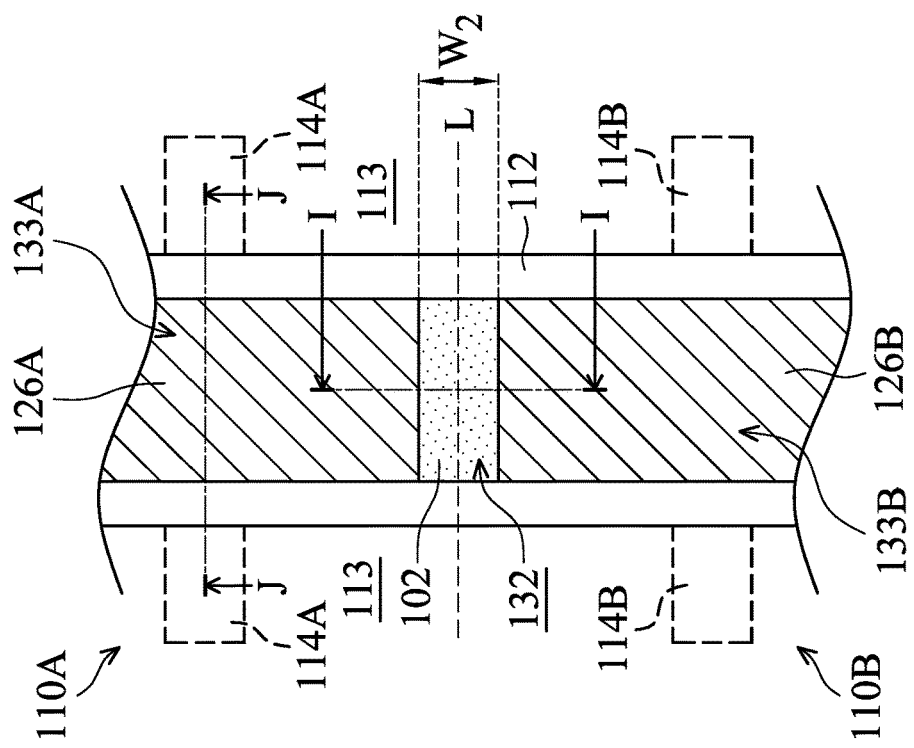
Figure 4:
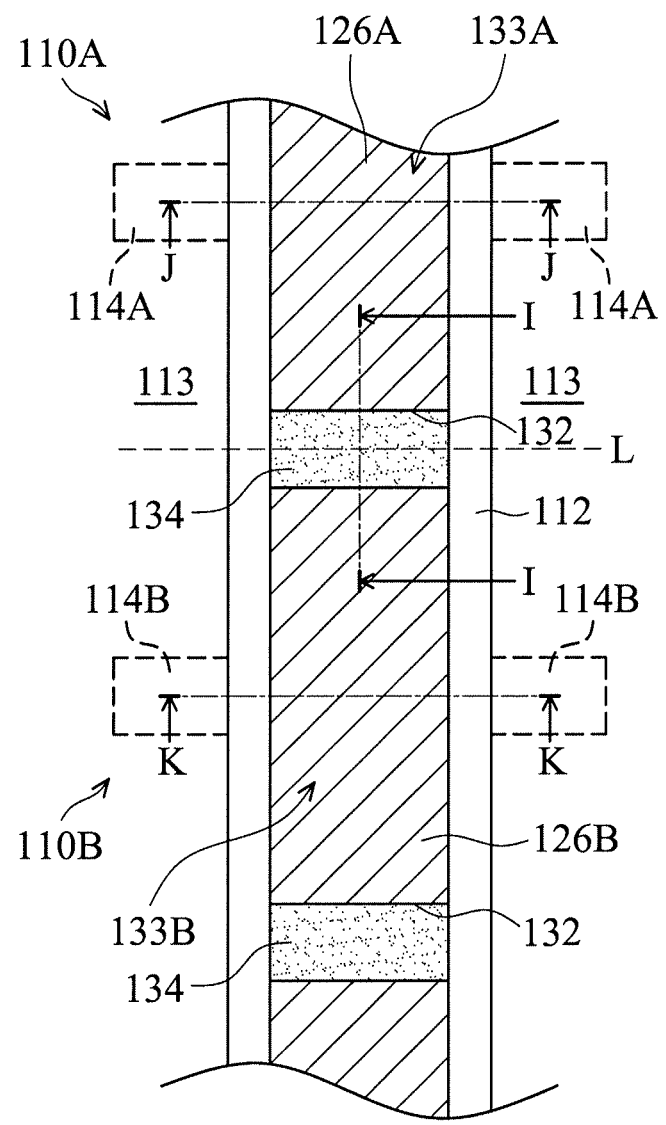
FIG. 4 is a top view of a semiconductor device structure, in accordance with some embodiments.

As shown in FIGS. 1F, 2F and 4, a portion of the metal gate stack layers is removed to form one or more recesses 132 in the metal gate stack layers, in accordance with some embodiments. The mask layer 128 is used to assist in the formation of the recess 132. In some embodiments, the mask layer 128 is removed after the recess 132 is formed. The recess 132 separates the metal gate stack layers into two or more gate stacks including the gate stacks 133A and 133B, as shown in FIGS. 1F and 2F in accordance with some embodiments.

The metal filling layer 126 is divided into multiple portions including metal fillings 126A and 126B. In these cases, the materials of the metal fillings 126A and 126B are the same. In some other embodiments, the metal fillings 126A and 126B have different materials. In these cases, two different metal filling layers are deposited and patterned to form the metal fillings 126A and 126B. In some embodiments, the gate dielectric layers of the gate stacks 133A and 133B are portions of the gate dielectric layer 118. In these cases, the gate dielectric layers of the gate stacks 133A and 133B have the same material.

The formation of the recess 132 may also be called an end cut process which cut "the metal gate stack line" (or the metal gate stack layers) into multiple separate metal gate stacks. The end cut process is performed after the deposition of the metal gate stack layers. The metal gate stack layers are deposited in the trench 116 which is large enough to contain two or more gate stacks and has a relatively low aspect ratio. Therefore, the depositions of the metal gate stack layers could be performed well. The quality and the reliability of the metal gate stack layers are improved significantly. The size, the profile, and the position of the recess 132 may be controlled more precisely. As a result, problems such as short circuiting or current leakage, are reduced or prevented.

As shown in FIG. 1F, the recess 132 has an upper width $W_2$, a lower width $W_1$, and a height H. In some embodiments, the width $W_2$ is wider than the width $W_1$. In a subsequent process, the recess 132 is filled with a dielectric structure. In some embodiments, if the width $W_2$ is wider than the width $W_1$, the filling of the dielectric structure is easier. However, embodiments of the disclosure are not limited thereto. In some other embodiments, the width $W_1$ is wider than the width $W_2$. In some embodiments, the width $W_1$ is substantially equal to the width $W_2$. In some embodiments, the width $W_1$ is in a range from about 10 nm to about 500 nm. In some embodiments, the width $W_2$ is in a range from about 15 nm to about 1000 nm. In some embodiments, the width H is in a range from about 50 nm to about 2000 nm.

By varying the etching conditions for forming the recess 132, the profile of the recess 132 can be tuned. For example, an angle θ between a sidewall of the recess 132 and the surface of the isolation structure 102 may be tuned by varying the etching conditions. In some embodiments, the angle θ is in a range from about 60 degrees to about 120 degrees. In some cases, the angle θ should be larger than about 60 degrees to ensure that the width $W_2$ is not too wide to cause a high resistance of the gate stacks 133A and 133B. In some cases, the angle θ should be smaller than about 120 degrees to ensure that the width $W_2$ is not too narrow to negatively affect a subsequent filling process.

Figure 1G:
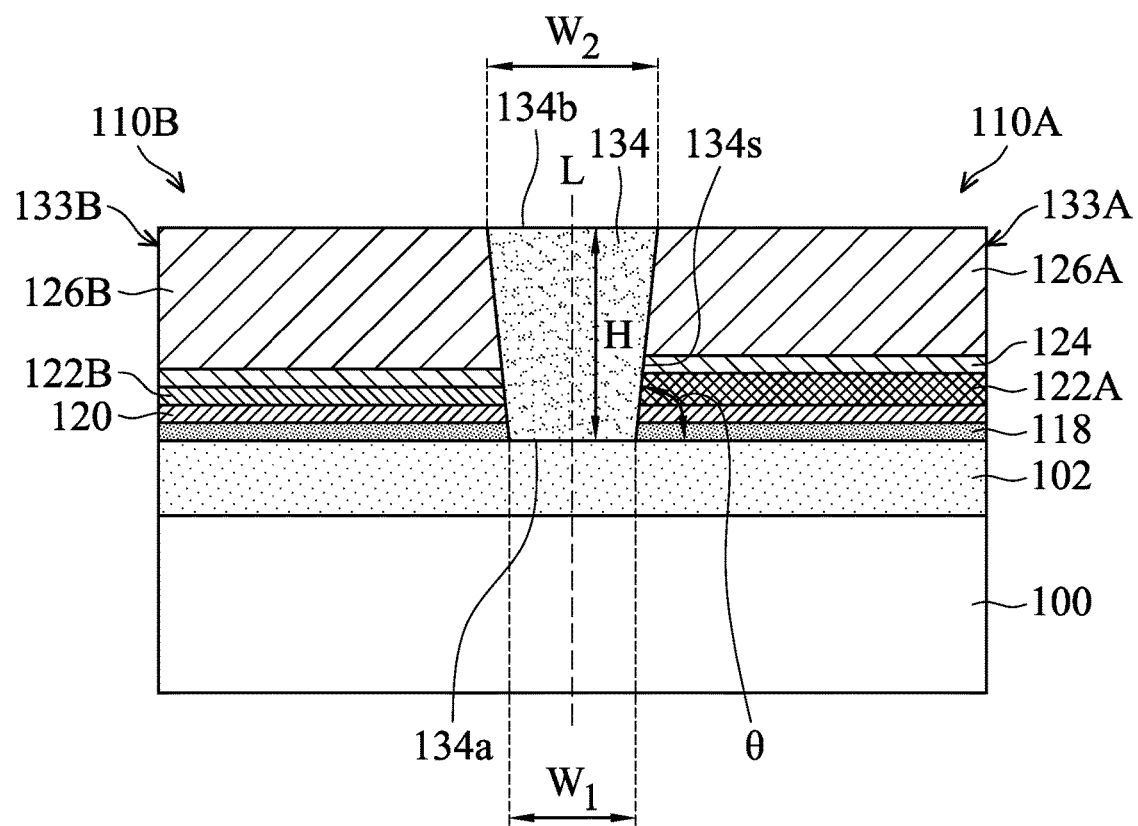

As shown in FIGS. 1G, 2G and 4, a dielectric structure 134 is formed in the one or more recess 132, in accordance with some embodiments. In some embodiments, the dielectric structure 134 is made of silicon oxide, silicon nitride, silicon oxynitride, carbon-containing silicon oxide, other suitable dielectric materials, or a combination thereof. In some embodiments, the material of the dielectric structure 134 is different from that of the dielectric layer 113 which surrounds the gate stacks 133A and 133B and the dielectric structure 134. However, embodiments of the disclosure are not limited thereto. In some embodiments, the materials of the dielectric structure 134 and the dielectric layer 113 are substantially the same.

In some embodiments, a dielectric filling layer is deposited over the metal fillings 126A and 126B to fill the recess 132. Afterwards, a planarization process is performed to remove the dielectric filling layer outside of the recess 132 until the metal fillings 126A and 126B are exposed. The planarization process may include a CMP process, a grinding process, an etching process, other applicable processes, or a combination thereof. As a result, the dielectric filling layer remaining in the recess 132 forms the dielectric structure 134, as shown in FIGS. 1G and 2G in accordance with some embodiments. Similarly, the dielectric filling layer remaining in the recesses 132 forms the dielectric structures 134, as shown in FIG. 4 in accordance with some embodiments.

In some embodiments, the dielectric structure 134 is formed using a deposition process suitable for filling a recess or an opening having a high aspect ratio. In some embodiments, the dielectric structure 134 is deposited using an ALD process, a flowable chemical vapor deposition (FCVD) process, other applicable processes, or a combination thereof. In some other embodiments, a spin-on process is used to form the dielectric structure 134.

Embodiments of the disclosure have many variations. In some embodiments, the dielectric structure 134 includes a multilayer structure. For example, multiple dielectric layers are deposited to fill the recess 132. Similarly, a planarization process may be performed to remove the multiple dielectric layers outside of the recess 132. As a result, the multiple dielectric layers remaining in the recess 132 form the dielectric structure 134.

As shown in FIGS. 1G and 2G, the dielectric structure 134 is adjacent to the gate stacks 133A and 133B, in accordance with some embodiments. In some embodiments, the dielectric structure 134 is in direct contact with the work function layers 122A and 122B and the metal fillings 126A and 126B of the gate stacks 133A and 133B, as shown in FIG. 1G. In some embodiments, the dielectric structure 134 is also in direct contact with the gate dielectric layer 120 of the gate stacks 133A and 133B. In some embodiments, the dielectric structure 134 is also in direct contact with the isolation structure 102, as shown in FIG. 1G.

As shown in FIG. 1G, the dielectric structure 134 has an upper side 134b and a lower side 134a between the upper side 134b and the semiconductor substrate 100. In some embodiments, the upper side 134b has a width equal to the width $W_2$, and the lower side 134a has a width equal to the width $W_1$. In some embodiments, the upper side 134b is wider than the lower side 134a. However, it should be appreciated that embodiments of the disclosure are not limited thereto. In some other embodiments, the lower side 134a is wider than the upper side 134b. In some other embodiments, the upper side 134b is substantially as wide as the lower side 134a.

As shown in FIG. 1G, the dielectric structure 134 has a sidewall 134s. The angle θ is between the sidewall 134s and the isolation structure 102. Similarly, the angle θ should not be too small to ensure that the width $W_2$ is not too wide to cause a high resistance of the gate stacks 133A and 133B. The angle θ should not be too large to ensure that the width $W_2$ is not too narrow to negative affect a subsequent filling process. For example, the angle θ is in a range from about 60 degrees to about 120 degrees.

As shown in FIGS. 1G and 2G, two transistors each including the gate stacks 133A and 133B are formed, in accordance with some embodiments. The dielectric structure 134 is formed between ends of the gate stacks 133A and 133B to electrically isolate the gate stacks 133A and 133B. The gate dielectric layer and the work function layer are in direct contact with lower portions of the dielectric structure 134, and the metal filling is in direct contact with an upper portion of the dielectric structure 134. Because each of the gate stacks is formed by patterning the metal gate stack layers, the height of the gate stack may be well controlled. In some embodiments, no planarization is performed to ensure different gate stacks to have the same height. Therefore, the associated processing cost and processing time are reduced. The residues generated during the planarization process are also reduced.

Embodiments of the disclosure provide mechanisms for forming a semiconductor device structure with one or more metal gate stacks. A dummy gate stack line is removed to form a trench where more than two metal gate stacks will be formed. Metal gate stack layers are formed to fill the trench. Afterwards, one or more recess are formed in the metal gate stack layers to separate the metal gate stack layers into two or more metal gate stacks. A dielectric structure is then formed in the recess to electrically isolate the metal gate stacks. Since the metal gate stack layers are deposited in the trench which is large enough to contain two or more gate stacks, the deposition of the metal gate stack layers can be well performed. The quality and the reliability of the metal gate stack layers are improved significantly, such as the embodiments shown in FIG. 2G or FIG. 4.

In accordance with some embodiments, a semiconductor device structure is provided. The semiconductor device structure includes a semiconductor substrate and a gate stack over the semiconductor substrate. The gate stack includes a work function layer and a metal filling over the work function layer. The semiconductor device structure also includes a dielectric structure over the semiconductor substrate and adjacent to the gate stack. The dielectric structure is in direct contact with the work function layer and the metal filling.

In accordance with some embodiments, a semiconductor device structure is provided. The semiconductor device structure includes a semiconductor substrate and a first gate stack and a second gate stack over the semiconductor substrate. The semiconductor device structure also includes a dielectric structure over the semiconductor substrate and between the first gate stack and the second gate stack. The dielectric structure is in direct contact with a first work function layer and a first metal filling of the first gate stack and a second work function layer and a second metal filling of the second gate stack.

In accordance with some embodiments, a method for forming a semiconductor device structure. The method includes forming a dummy gate stack over a semiconductor substrate. The method also includes removing the dummy gate stack to form a trench over the semiconductor substrate and forming metal gate stack layers in the trench. The method further includes forming one or more recesses in the metal gate stack layers to separate the metal gate stack layers into two or more gate stacks. In addition, the method includes forming a dielectric structure in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a gate stack over the semiconductor substrate, wherein the gate stack comprises a work function layer, a gate dielectric layer, and a metal filling over the work function layer;
   a first dielectric structure over the semiconductor substrate and adjacent to the gate stack, wherein the first dielectric structure is in direct contact with the metal filling;
   a second dielectric structure over the semiconductor substrate and adjacent to the gate stack, wherein the second dielectric structure is in direct contact with the metal filling; and
   spacer elements adjacent to and sandwiching the gate stack, the first dielectric structure, and the second dielectric structure, wherein the first dielectric structure and the second dielectric structure are in direct contact with one of the spacer elements.

2. The semiconductor device structure as claimed in claim 1, wherein the gate dielectric layer is between the semiconductor substrate and the work function layer, and the gate dielectric layer is in direct contact with the first dielectric structure.

3. The semiconductor device structure as claimed in claim 1, further comprising an isolation structure between the semiconductor substrate and the gate stack, wherein the first dielectric structure is in direct contact with the isolation structure.

4. The semiconductor device structure as claimed in claim 1, wherein an angle between a sidewall of the first dielectric structure and an isolation structure under the first dielectric structure is in a range from about 60 degrees to about 120 degrees.

5. The semiconductor device structure as claimed in claim 1, wherein the first dielectric structure has an upper side and a lower side between the upper side and the semiconductor substrate, and the upper side is wider than the lower side.

6. A semiconductor device structure, comprising:
   a semiconductor substrate;
   a first gate stack and a second gate stack over the semiconductor substrate;
   a first dielectric structure over the semiconductor substrate and between the first gate stack and the second gate stack, wherein the first dielectric structure is in direct contact with a first work function layer and a first metal filling of the first gate stack and a second work function layer and a second metal filling of the second gate stack;
   a first gate dielectric layer between the semiconductor substrate and the first work function layer;
   a second dielectric structure over the semiconductor substrate, wherein the second gate stack is between the first dielectric structure and the second dielectric structure, the second dielectric structure is in direct contact with a second work function layer and a second metal filling of the second gate stack; and
   spacer elements adjacent to and sandwiching the first gate stack, the second gate stack, the first dielectric structure, and the second dielectric structure, wherein the first dielectric structure and the second dielectric structure are in direct contact with one of the spacer elements.

7. The semiconductor device structure as claimed in claim 6, further comprising:
   a second gate dielectric layer between the semiconductor substrate and the second work function layer, wherein the first dielectric structure is in direct contact with the first gate dielectric layer and the second gate dielectric layer.

8. The semiconductor device structure as claimed in claim 7, wherein materials of the first gate dielectric layer and the second gate dielectric layer are the same.

9. The semiconductor device structure as claimed in claim 6, further comprising an isolation structure between the semiconductor substrate and the first gate stack, wherein the first dielectric structure is in direct contact with the isolation structure.

10. The semiconductor device structure as claimed in claim 6, further comprising a dielectric layer over the semiconductor substrate and surrounding the first gate stack, the second gate stack, the first dielectric structure, and the spacer elements.

11. The semiconductor device structure as claimed in claim 6, wherein materials of the first metal filling and the second metal filling are the same.

12. The semiconductor device structure as claimed in claim 1, wherein a width of the work function layer is different from that of the metal filling.

13. The semiconductor device structure as claimed in claim 1, wherein tops of the gate stack and the first dielectric structure are substantially coplanar.

14. The semiconductor device structure as claimed in claim 6, wherein the first dielectric structure includes a multilayer structure.

15. The semiconductor device structure as claimed in claim 1, wherein the metal filling is not in direct contact with the spacer elements.

16. The semiconductor device structure as claimed in claim 6, wherein the first work function layer is thicker than the second work function layer.

17. The semiconductor device structure as claimed in claim 5, wherein the lower side has a width in a range from about 10 nm to about 500 nm, the upper side has a width in a range from about 15 nm to about 1000 nm, and a height of the first dielectric structure is in a range from about 50 nm to about 2000 nm.

18. The semiconductor device structure as claimed in claim 6, further comprising:
   a first blocking layer between the first work function layer and the first metal filling; and
   a second blocking layer between the second work function layer and the second metal filling, wherein the first blocking layer and the second blocking layer are different layers.

19. A semiconductor device structure, comprising:
   a semiconductor substrate;
   a metal gate stack over the semiconductor substrate, wherein the gate stack comprises a work function layer, a gate dielectric layer, and a metal filling over the work function layer;
   a first dielectric structure and a second dielectric structure over the semiconductor substrate, wherein the metal gate stack is between the first dielectric structure and the second dielectric structure, and the metal filling is in direct contact with the first dielectric structure and the second dielectric structure; and
   a spacer element surrounding the metal gate stack, the first dielectric structure, and the second dielectric structure, wherein the first dielectric structure and the second dielectric structure are in direct contact with the spacer element.

20. The semiconductor device structure as claimed in claim 19, further comprising a dielectric layer over the semiconductor substrate, wherein the dielectric layer surrounds the spacer element, and the dielectric layer and the first dielectric structure are made of different materials.

* * * * *